US010775671B2

(12) United States Patent
Lüchinger et al.

(10) Patent No.: US 10,775,671 B2
(45) Date of Patent: Sep. 15, 2020

(54) DISPLAY DEVICE

(71) Applicant: AVANTAMA AG, Stäfa (CH)

(72) Inventors: Norman Lüchinger, Meilen (CH); Ines Weber, Thalwil (CH); Stefan Loher, Zürich (CH); Marek Oszajca, Zürich (CH); Benjamin Hartmeier, Zürich (CH)

(73) Assignee: AVANTAMA AG, Stäfa (CH)

( * ) Notice: Subject to any disclaimer, the term of this patent is extended or adjusted under 35 U.S.C. 154(b) by 0 days.

(21) Appl. No.: 16/065,156

(22) PCT Filed: Dec. 21, 2016

(86) PCT No.: PCT/EP2016/082198
§ 371 (c)(1),
(2) Date: Jun. 22, 2018

(87) PCT Pub. No.: WO2017/108962
PCT Pub. Date: Jun. 29, 2017

(65) Prior Publication Data
US 2019/0018287 A1    Jan. 17, 2019

(30) Foreign Application Priority Data
Dec. 23, 2015  (EP) .................................. 15003667

(51) Int. Cl.
H01L 33/50        (2010.01)
G02F 1/13357      (2006.01)
H01L 27/32        (2006.01)
C09K 11/66        (2006.01)
G02F 1/1335       (2006.01)

(52) U.S. Cl.
CPC ...... *G02F 1/133617* (2013.01); *C09K 11/665* (2013.01); *G02F 1/133514* (2013.01); *H01L 27/322* (2013.01); *H01L 33/502* (2013.01); *H01L 2251/5369* (2013.01)

(58) Field of Classification Search
CPC ......... G02F 1/133617; G02F 1/133514; H01L 33/502; H01L 27/322; H01L 2251/5369; C09K 11/665
See application file for complete search history.

(56) References Cited

U.S. PATENT DOCUMENTS

| | | | | |
|---|---|---|---|---|
| 10,326,058 B2 * | 6/2019 | Luchinger | ............ | G02F 1/1336 |
| 2006/0002141 A1 * | 1/2006 | Ouderkirk | ............ | G02B 6/0001 |
| | | | | 362/609 |
| 2007/0121129 A1 * | 5/2007 | Eida | ...................... | B82Y 20/00 |
| | | | | 358/1.9 |
| 2008/0014463 A1 * | 1/2008 | Varadarajan | ......... | C09K 11/616 |
| | | | | 428/690 |
| 2011/0155296 A1 * | 6/2011 | Nakamura | ............. | G02B 5/201 |
| | | | | 156/67 |
| 2012/0287381 A1 * | 11/2012 | Li | ..................... | G02F 1/133617 |
| | | | | 349/106 |
| 2013/0320836 A1 * | 12/2013 | Kanatzidis | ............ | H01L 31/032 |
| | | | | 313/483 |
| 2014/0103373 A1 * | 4/2014 | Li | ........................ | H01L 33/502 |
| | | | | 257/88 |
| 2014/0231753 A1 | 8/2014 | Chen et al. | | |
| 2014/0312339 A1 * | 10/2014 | Fujita | .................... | H01L 27/322 |
| | | | | 257/40 |
| 2014/0339585 A1 | 11/2014 | Liao et al. | | |
| 2015/0042933 A1 | 2/2015 | Ueki et al. | | |
| 2015/0047765 A1 | 2/2015 | Vo et al. | | |
| 2015/0219832 A1 * | 8/2015 | Baek | .................... | G02B 6/0031 |
| | | | | 362/607 |
| 2016/0005994 A1 | 1/2016 | Fukagawa et al. | | |

FOREIGN PATENT DOCUMENTS

CN        105103325 A       11/2015

OTHER PUBLICATIONS

International Search Report for corresponding International Application No. PCT/EP2016/082198 dated Mar. 22, 2017.
Written Opinion of the International Searching Authority for corresponding International Application No. PCT/EP2016/082198 dated Mar. 22, 2017.

(Continued)

*Primary Examiner* — Donald L Raleigh
(74) *Attorney, Agent, or Firm* — Renner, Otto, Boisselle & Sklar, LLP

(57) ABSTRACT

A display device includes a light emitter comprising a set of light emitter portions, wherein at least one light emitter portion of the set is configured to emit light with an excitation wavelength, and a color conversion layer including a set of conversion layer portions. At least one conversion layer portion of the set comprises a film comprising a solid polymer composition that includes luminescent crystals of perovskite structure, which are selected from compounds of formula (I): $M^1{}_aM^2{}_bX_c$ (I), wherein $M^1$ represents Cs, $M^2$ represents Pb, and X independently represents anions selected from the group consisting of Cl, Br, I, cyanide, and thiocyanate. The luminescent crystals are of size between 3 nm and 3000 nm, and emit light of a wavelength in response to excitation by the light emitted by at least one corresponding light emitter portion of the set, wherein the excitation wavelength is shorter than the wavelength.

20 Claims, 2 Drawing Sheets

(56) References Cited

OTHER PUBLICATIONS

Protesescu et al., "Nanocrystals of Cesium Lead Halide Perovskites (CsPbX3, X=Cl, Br, and I): Novel Optoelectronic Materials Showing Bright Emission with Wide Color Gamut", Nano Letters, vol. 15, 2015, pp. 3692-3696 (cited in specification on p. 2).
Bolton et al., "Tuning the Photophysical Properties of Metal-Free Room Temperature Organic Phosphors via Compositional Variations in Bromobenzaldehyde/Dibromobenzene Mixed Crystals", Chemistry of Materials, vol. 26, No. 22, 2014, pp. 6644-6649.

\* cited by examiner

DISPLAY DEVICE

This application is a national phase of International Application No. PCT/EP2016/082198 filed Dec. 21, 2016 and published in the English language, which claims priority to European Application No. 15003667.1 which is incorporated herein by reference.

TECHNICAL FIELD

The present invention relates to the field of luminescent crystals (LCs). The invention provides a display device.

BACKGROUND ART

Displays are an integral part of our world and are implemented in different sizes into a broad range of electronic devices. In particular color displays are very popular giving rise to various technologies for maximizing their color gamut, i.e. the broad spectrum of colors that can be displayed.

For displaying a broad range of colors, most of the common display technologies, such as the liquid crystal display (LCD) technology, relay on the integration of color filters for filtering the red, green and blue light of the respective light source. The desired color hue is therefore achieved by controlling the intensity of the red, green and blue light.

The color gamut of such displays is limited to the color spectrum emitted by the respective light source, which light source is typically not centred to the primary red, blue, and green wavelengths, and thus renders the displaying of highly saturated colors impossible.

DISCLOSURE OF THE INVENTION

According to an aspect of the present invention, a display device is provided. The display device comprises a light emitter comprising a set of light emitter portions, and a color conversion layer comprising a set of conversion layer portions, at least one of the conversion layer portions of the set is configured to emit light of a wavelength in response to an excitation with light emitted by at least one corresponding light emitter portion of the set. The at least one light emitter portion of the set is configured to emit light with an excitation wavelength. This emitted light excites luminescent crystals in the at least one color conversion layer which in response to the excitation emit light of a wavelength different to the shorter excitation wavelength of preferably blue light of a wavelength in a range between 400 and 490 nm.

For providing the subject light emitting properties, the subject color conversion portion comprises luminescent crystals for emitting the light of the defined wavelength in response to the excitation. The luminescent crystals may be embedded in a solid polymer composition comprising a polymer next to the luminescent crystals. The solid polymer composition contributes to the color conversion portion in form of a film.

Suitable luminescent crystals are of the perovskite structure. Such perovskite structures are known per se and described as cubic, pseudocubic, tetragonal or orthorhombic crystals of general formula $M^1M^2X_3$, where $M^1$ are cations of coordination number 12 (cuboctaeder) and $M^2$ are cations of coordination number 6 (octaeder) and X are anions in cubic, pseudocubic, tetragonal or orthorhombic positions of the lattice. In these structures, selected cations or anions may be replaced by other ions (stochastic or regularly), still maintaining its crystalline structure. The manufacturing of such luminescent crystals is known, e.g. from Protesescu et al. (Nano Lett., 2015, 15, 3692-3696).

Advantageously, the luminescent crystals are selected from compounds of formula (I):

$$M^1{}_aM^2{}_bX_c \qquad (I),$$

wherein
$M^1$ represents Cs,
$M^2$ represents Pb,
X independently represents anions selected from the group consisting of Cl, Br, I, cyanide and thiocyanate,
a represents 1,
b represents 1,
c represents 3.

Independently means that X may be selected from one of the above named anions or may be a combination of more than one of the above anions. The term thiocyanate shall include both resonance structures, i.e. thiocyanate and isothiocyanate.

In embodiments of the invention, $M^1$ may be doped with up to 30 mol % of one or more other metals having coordination number 12 within the perovskite structure. Advantageously, $M^1$ is doped with up to 10 mol % of one or more of such metals. Suitable metals $M^1$ are selected from the group consisting of Rb, K, Na, and Li.

In embodiments of the invention, $M^2$ may be doped with up to 30 mol % of one or more other metals having coordination number 6 within the perovskite structure. Advantageously, $M^2$ is doped with up to 10 mol % of one or more of such metals. Suitable metals $M^2$ are selected from the group consisting of Ge, Sn, Sb and Bi.

In embodiments of the invention, X is selected from one of Cl, Br and I; or X represents independently two of Cl, Br and I; or X represents Cl, Br and I. The amount of Cl, Br, I, cyanide and thiocyanate may be determined by routine experiments such as MS or XRF, which are known in the field; the small Cl anion shifts the emission towards the blue, the large I anion towards the red and the medium sized Br anion towards the green part of the visible spectrum.

The luminescent crystals are of size between 3 nm and 3000 nm, and in particular between 5 and 100 nm.

Accordingly, cesium lead halide nanocrystals and/or doped cesium lead halide nanocrystals, which are of the perovskite structure, are preferably used as luminescent crystals. The emission of light with a specific wavelength depends on a selection of the material of the luminescent crystals within the above constraints, and may depend on a size of the luminescent crystals.

The color conversion layer comprises a set of at least one and preferably multiple color conversion layer portions. A conversion layer portion is understood as a portion that individually converts the blue light from the assigned light emitter portion into a dedicated color. Hence, the film of a conversion layer portion solely comprises luminescent crystals of one type selected according to the formula (I) for emitting light of the dedicated color.

The light emitter comprises a set of at least one, and preferably multiple light emitter portions. A light emitter portion is understood as a portion that is individually addressable and/or controllable to emit light. Multiple light emitter portions can hence be controlled individually such that, for example, individual ones of these light emitter portions can be controlled to emit light while at the same time the remaining ones can be controlled not to emit light or to emit light of different intensity. Specifically, each light emitter portion is provided with individual contacts for receiving a control signal.

In a preferred embodiment, multiple light emitter portions are provided in the corresponding set and multiple conversion layer portions are provided in the corresponding set. Here, a dedicated light emitter portion is assigned to one of the conversion layer portions to excite the luminescent crystals comprised therein. In case of the number of light emitter portions is equal to the number of conversion layer portions, there is a one-to-one relation between the light emitter portions and the conversion layer portion, such that each conversion layer portion has its own assigned light emitter portion. However, it is very preferred that the number of light emitter portions exceeds the number of conversion layer portions, such that each conversion layer portion has an assigned light emitter portion, while a number of light emitter portions do not have an assigned conversion layer portion. These remaining light emitter portions emit light that may not be converted by any color conversion portion, but may be used for adding the excitation wavelength to the overall spectrum of emitted light, e.g. as part of a pixel as will be introduced later on, which pixel is tunable as to emit light of variable colors/wavelengths and which pixel contributes to a display.

In a different embodiment, a single light emitter portion is provided in the corresponding set in combination with multiple conversion layer portions. In this embodiment, it is preferred that other control elements—such as liquid crystals—are provided in a path of the excitation light towards each conversion layer portion in order to control an excitation per conversion layer portion.

At least one, and preferably each conversion layer portion comprises a film. Each film comprises a solid polymer composition, wherein the solid polymer composition comprises the assigned luminescent crystals. Preferably, a film is defined having at least one of a length and a width—and preferably both—exceeding a height/thickness of the film. A film in this context may also be referred to as an element. Dimensions of the film may include a thickness of the film being one of less, equal or more than each of a length and a width of the film.

In a preferred embodiment, the color conversion layer comprises a first conversion layer portion including a first film. The first film is configured to emit red light, preferably in response to an excitation with the blue light stemming from the light emitter. The first film comprises a first solid polymer composition which in turn comprises first luminescent crystals. The red light emitting property of the first luminescent crystals preferably is a result from the proper selection of the material composition at a defined size. Red light is considered light with a peak wavelength in the range between 590 nm and 700 nm.

The color conversion layer preferably comprises in addition to the first conversion layer portion a second conversion layer portion including a second film. The second film is configured to emit green light, preferably in response to an excitation with the blue light stemming from the light emitter. The second film comprises a second solid polymer composition which in turn comprises second luminescent crystals. The green light emitting property of the second luminescent crystals preferably is a result from the proper selection of the material composition at a defined size. The green luminescent crystals preferably have a different chemical composition and/or a different size than the red luminescent crystals. Green light is considered light with a peak wavelength in a range between 490 nm and 570 nm. In a preferred embodiment, one or more of the first and the second film may comprise scattering particles, such as $TiO_2$ or $ZrO_2$.

Preferably, the first luminescent crystals are of above formula (I) and the corresponding size, and the second luminescent crystals are of the above formula (I) and of the corresponding size.

In a preferred embodiment, the first luminescent crystals are of formula (I-1)

$$CsPbI_xZ_{3-z} \qquad (I-1),$$

wherein $1 < x \leq 3$,

Cs, Pb is optionally doped with up to 30 mol % as described above,

Z represents one or more of Cl, Br.

Particularly advantageously, the first luminescent crystals are of formula $CsPbBr_xI_{3-x}$, where $0 \leq x < 2$ and/or of formula $CsPbCl_yBr_{3-y-z}I_z$, where $0 < y < 1$, $2 \leq z \leq 3-y$.

Advantageously, the second luminescent crystals are of formula (I-2)

$$CsPbBr_xZ_{3-z} \qquad (I-2),$$

wherein $2 \leq x \leq 3$,

Cs, Pb is optionally doped with up to 30 mol % as described above,

Z represents one or more of Cl, I.

Particularly advantageously, the second luminescent crystals are of formula $CsPbCl_yBr_zI_{3-y-z}$, where $0 < y < 1$, $1 < z \leq 3-y$, and/or of formula $CsPbBr_xI_{3-x}$, where $2 \leq x \leq 3$.

In a very preferred embodiment, the first luminescent crystals designed for emitting red light are compounds of formula $CsPbBr_xI_{3-x}$ whereby $0 \leq x < 2$, or of formula $CsPbCl_yBr_{3-y-z}I_z$, where $0 < y < 1$, $2 \leq z \leq 3-y$, and show a peak wavelength in the range between 590 nm and 700 nm, preferably with an FWHM between 15 and 50 nm.

In a very preferred embodiment, the second luminescent crystals are designed for emitting green light are compounds of formula $CsPbCl_yBr_zI_{3-y-z}$, whereby $0 < y < 1$, $1 < z \leq 3-y$, or of formula $CsPbBr_xI_{3-x}$, whereby $2 \leq x \leq 3$, and show a peak wavelength in the range between 490 nm and 570 nm, preferably with an FMWH between 15 and 50 nm.

For both of the previous embodiments, a size of each of the first and second luminescent crystals is between 5 nm and 100 nm.

Preferably, the first film comprises first luminescent crystals only and is free from second luminescent crystals, while the second film comprises second luminescent crystals only and is free from first luminescent crystals. Preferably, the first film comprises first luminescent crystals only and is free from any other luminescent crystals, and the second film comprises second luminescent crystals only and is free from any other luminescent crystals. By these means, the first film is dedicated to solely emitting red light in response to an excitation, but no green light or light of a different color, respectively, while the second film is dedicated to solely emitting green light in response to an excitation, but no red light or light of a different color, respectively. This concept may hold for any first film in case of multiple first films, and for any second film in case of multiple second films, which multiple film concept will be introduced later on.

The present color conversion layer provides for a spatial separation of the first and the second luminescent crystals. The separation is achieved by an arrangement of the first luminescent crystals in the dedicated first film only and by an arrangement of the second luminescent crystals in the dedicated second film only, and possibly in addition by means of a gap between the first film and second film. By doing so, an exchange of cations and anions between the first luminescent crystals and the second luminescent crystals is avoided. Given that the fabrication of each of the films preferably is performed in a separate suspension, a mixing of first luminescent crystals and second luminescent crystals in a common suspension is avoided. Such mixing instead would result in a conversion of the origin first and second luminescent crystals into different luminescent crystals by way of reaction/recombination based on the above mentioned ion exchange. As a result, such different luminescent crystals would emit light of a different wavelength than the first or second luminescent crystals. Without being bound to theory, due to such an ion exchange reaction a resulting formulation of above red and green luminescent crystals would, depending on the effective compositions of the red and green particles emit a light with a wavelength between the original red and green emission peaks. Instead, the first and the second luminescent crystals are separated at the stage of manufacturing, and hence are added to different portions of the suspension resulting in the above first and second films after hardening/curing/drying.

By doing so, the luminescent crystals emitting green light (also referred to as green luminescent crystals) do not interact with luminescent crystals emitting red light (also referred to as red luminescent crystals). Each portion of the suspension preferably comprises the assigned luminescent crystals, a solvent, a ligand, and a polymer. Given that the resulting films are solid films, an interaction of the first luminescent crystals in the first film with the second luminescent crystals in the second film is avoided. In case of an adjacent arrangement of the first film and the second film, such interaction is avoided to a large extent, given that only cations/anions of the LCs residing at the interface of the first and the second film may recombine.

The present device provides an excellent photoluminescence quantum yield.

The term "quantum yield (QY)" is known in the field and relates to the amount of times a specific event occurs per photon that is absorbed in the system. In the context of the present invention the term "quantum yield" refers to the "photoluminescence quantum yield" of the described substance and both terms are used with identical meaning. The "photoluminescence quantum yield" defines how many photons of a higher wavelength (lower energy) are emitted by the described system per photon that is absorbed by the system.

For example, the quantum yield of the solid polymer compositions suggested to be used in the present films is in total >60%, and preferably >80%, most preferably >90%, preferably when excited by blue light. In addition, owed to the material selection, the crystal size, and the strict separation of the green and the red LCs, sharp wavelength distributions can be achieved in the emitted red and green light respectively, such that the quality of the resulting emitted light is superior. Preferably, the FWHM (Full Width at Half Maximum) of the solid polymer composition of each of the first film and the second film for visible emissions is <50 nm, preferably, <40 nm, and most preferably <30 nm, each in the range of red or green light respectively. For example, an FWHM for the emission peak at 500 nm of 22 nm can be observed, at the same time measuring a high luminescence quantum yield of e.g. 76%.

Embodiments of the present device comply with RoHS ("Restriction of Hazardous Substances") Directive by the European Union. At the time of the filing of the present patent application the applicable directive 2011/65/EU generally restricted the use of the following elements: Lead (Pb) <1000 ppm by weight, Mercury (Hg)<1000 ppm, Cadmium (Cd)<100 ppm, Hexavalent chromium (Cr6+)<1000 ppm, Polybrominated biphenyls (PEE)<1000 ppm, Polybrominated diphenyl ether (PBDE)<1000 ppm. On the one hand, this is achieved by selecting Cd-free material, which still provides excellent quantum yield/performance. The limit for Pb according to the RoHS Directive Version 2 (2011/65/EU) is 1000 ppm, which is achieved in the present embodiments on a per-film basis, and is achieved in total for each conversion layer portion and the color conversion layer as such. Preferably, the total Pb concentration for each conversion layer portions according to any of the present embodiments is below 1000 ppm, more preferably in a range of 30 ppm and 1000 ppm, and most preferably between 100 ppm and 900 ppm. The RoHS compliance may be achieved by selecting an appropriate concentration of the first and second luminescent crystals in the first and second film respectively, and by dimensioning a thickness of the first and the second film. The subject concentration can be measured by MS or XRF measurements.

Preferably, a concentration of the respective luminescent crystals with respect to a polymer matrix of the solid polymer composition per film is within a range of 0.01 wt % and 0.5 wt %. In case of a first film emitting red light, the concentration of the first luminescent crystals preferably is between 0.01 wt % and 0.5 wt %, preferably between 0.05 wt % and 0.38 wt %, most preferably between 0.1 wt % and 0.35 wt %; and preferably between 0.01 wt % and 0.50 wt %, preferably between 0.05 wt % and 0.31 wt %, most preferably between 0.1 wt % and 0.28 wt % for a second film emitting green light. The upper limit of this concentration range supports RoHS compliance on the one hand, while the lower limit of this concentration range provides for a sufficient emission at reasonable film thicknesses of the conversion layer portions on the other hand.

Preferably, a thickness per film is between 5 μm and 500 μm. Preferably, a thickness of the film is between 5 μm and 500 μm, for absorbing the blue light emitted by the corresponding light emitter portion of the set. Preferably, a thickness of a first film emitting red light is between 5 μm and 500 μm, more preferably between 10 μm and 500 μm, most preferably between 40 μm and 200 μm and a thickness of a second film emitting green light is between 30 μm and 500 μm, preferably between 50 μm and 500 μm, most preferably between 70 μm and 400 μm. When keeping the total amount of luminescent crystals in the film constant, the lower limit of the thickness range supports RoHS compliance on the one hand, while the upper limit of the thickness range provides for a limited material usage in the device on the other hand.

The amount of luminescent crystals in respect to the film surface is very low, typically in the range of below 2.0 g/m$^2$ and very preferably below 1.5 g/m$^2$. When compared to conventional CdSe or InP materials, the same absorption rate of such films can only be achieved by a roughly 1.8 times higher amount of material. For example, it was found that absorption of 99.9% of blue light requires 2.2 g/m$^2$ for CdSe compared to 1.2 g/m$^2$ for $CsPbBr_3$ only.

In a preferred embodiment of the invention, the film comprising 1.0 g/m$^2$ to 1.5 g/m$^2$ luminescent crystals (such as 1.2 g/m$^2$ $CsPbBr_3$), has a thickness of around 400 to 500 μm, in particular 500 μm, and absorbs completely the blue light of the corresponding light emitter portion (in particular 99.9% of it). This layer emits light of a longer wavelength, in particular green or red light.

For the fabrication of films of such color conversion layers, materials with a high absorption rate are advantageous. In particular, a high absorption rate allows the fabrication of thinner films, which is e.g. important for the production of display devices. In addition, thinner films require less matrix material and therefore the costs for their fabrication are reduced.

A concurrent high quantum yield, RoHS compliance, low material usage, a stable peak position and narrow FWHM in the emitted spectrum, a tunable emission spectrum and a high stability represents a major achievement of the present invention over the art. Conventionally, CdSe or InP materials were suggested for LCs. However, while the first provides a sufficient quantum yield, RoHS compliance is challenging and often relies on regulatory exemptions. The latter on the other hand is RoHS compliant but shows inferior optical qualities (quantum yield<60%; FWHM>40 nm). In contrast, the conversion layer portion of the present invention provides both, a good quantum yield, low peak FWHM and RoHS conformity. This is achieved by selecting appropriate materials for LCs, applying appropriate LC concentrations and film thicknesses and at the same time arranging the different LCs in different films, as a result separating the LCs from each other to avoid ion exchange reactions.

Compared to conventionally used color filters, which tune the color only by absorbing certain wavelengths from the white spectrum the properties of the present embodiments of the invention are superior. While in conventional color filters most of the incident light energy is lost to absorption, in the case of the present invention, depending on the quantum yield of the used materials, more than 90% of the incoming light can be converted to the desired color. This leads to devices with much better energy efficiency.

As to further specifying optical properties, it is preferred that both of the first and the second film has a haze between 10 and 99%. A haze may be introduced by scattering particles with RI>2.0 and size of 100-1000 nm, or by microstructures or microcrystalline polymer structures. A concentration of scattering particles in the color conversion layer preferably is between 1 and 40 wt %, and preferably between 3 and 20 wt %.

In one embodiment, the films of the various conversion layer portions of the set are separated from each other, e.g. by a gap filled with air or by a different solid material (e.g. such as black matrix structures in LCD displays). In a different embodiment, the films of the various conversion layer portions of the set are arranged adjacent to each other. Hence, the color conversion layer not necessarily requires continuous portions thereof. Instead, separate portions, preferably arranged on the same level, may contribute to the color conversion layer.

In one embodiment, the portions of the light emitter are separated from each other, e.g. by a gap filled with air or by a different solid material (e.g. such as black matrix structures in LCD displays). Hence, the light emitter not necessarily requires continuous portions thereof. Instead, separate light emitter portions, preferably arranged on the same level, may contribute to the light emitter. Preferably, the light emitter has a flat shape having at least one of a length and a width—and preferably both—exceeding a height/thickness of the light emitter. This preferably is also true for individual light emitter portions contributing to the light emitter.

In a preferred embodiment, each conversion layer portion is attached to the light emitter portion assigned.

In a preferred embodiment, a substrate is provided for supporting the light emitter. Hence, the light emitter portions are attached to the substrate, e.g. by bonding or an attachment layer inbetween, which may supply control signals for the light emitter portions. The substrate may be a polymer substrate, such as a polyethylenterephthalat substrate or an inorganic material such as glass. The substrate preferably is a sheet-like structure, preferably of a length and a width both exceeding a height/thickness of the substrate, and preferably both exceeding its thickness at least ten times. In this embodiment, the light emitter is arranged between the color conversion layer and the substrate.

In another embodiment, one or more barrier layers may be provided, preferably each barrier layer having a water vapor transmission rate of less than 0.2 (g*mm)/(m^2*day) at a temperature of 20-50° C./90% relative humidity and atmospheric pressure. In any of the above and below embodiments, the device may include a barrier layer on top of an otherwise exposed surface of the color conversion layer. Such barrier layer may in particular have a low water vapour transmission rate in order to avoid a degradation of the LCs in the film/s in response to being exposed to water. The barrier layer may in one embodiment be permeable for $O_2$, or, in a different embodiment, may also be impermeable for oxygen. Preferably, the barrier layer is transmissive for light, and preferably, such barrier layer may be present in the form of a single layer or in the form of multilayers. The barrier layer preferably comprises organic polymers and/or inorganic materials. Suitable organic polymers may be selected from the group consisting of polyvinylidene chlorides (PVdC), cyclic olefin copolymer (COC), high-density polyethylene (HDPE); suitable inorganic materials may be selected from the group consisting of metal oxides, $SiO_x$, $Si_xN_y$. Most preferably, a polymer barrier layer comprises materials selected from the group of PVdC and COC.

In this embodiment, the color conversion layer is arranged between the light emitter and the barrier layer.

The barrier layer preferably encompasses the color conversion layer as a whole or the conversion layer portions. Encompassing may refer to a covering of the color conversion layer after having deposited the color conversion layer onto the light emitter.

The barrier layer may also directly cover light emitter portions that are not covered by an assigned conversion layer portion.

In one embodiment, the substrate if any may also act as a barrier layer such that an exposed surface of the substrate may not necessarily be covered by a dedicated barrier layer. In a different embodiment, however, and in particular when the substrate is transmissive to water, an otherwise exposed surface of the substrate may also be covered by a barrier film.

Preferably, the substrate, the light emitter, the color conversion layer, and the barrier layer are vertically stacked, i.e. orthogonal to their plane extensions. On the other hand, the various films of the conversion layer portions are arranged lateral to each other.

The display device may have a planar extension with a diagonal of more than 3 inches, e.g. as a display of a handhelds or preferably with a diagonal of more than 15 inches as a display for a computer or a TV. Although the above requires a rectangular plane extension of each of the substrate if any, the first film and the second film, it is emphasized that the scope is not limited to rectangular components. The display device may also take a different basic shape, such as a shape of a circle, an ellipse, etc.

In a different variant, one or more intermediate layers, in particular of light transmissive property, may be arranged between one or more of the substrate and the light emitter, the light emitter and the color conversion layer, the color conversion layer and the barrier layer, if any. It is noted that the size of each individual piece of the film of a conversion layer portion preferably is below a size that is detectable by eye in the final application (comparable to the pixel size in LCD screens).

Any of above embodiments of the device are not limited to a single first film and a single second film. It is preferred, that multiple first films comprising the first solid polymer composition and multiple second films comprising the second solid polymer composition are arranged on the same level and contribute to the color conversion layer.

In this context, an arrangement of a conversion layer portion in combination with an assigned light emitter portion is considered as a sub-pixel. Preferably, a pixel is formed by a first sub-pixel including the first film with red luminescent crystals, a second sub-pixel including the second film with green luminescent crystals, and a third sub-pixel that does not include a film with any luminescent crystals, but that emits blue light in case the assigned light emitter portion is activated. For this purpose, the color conversion layer may comprise portions that do not include a film comprising luminescent crystals, i.e. the portion that is part of the third sub-pixel. Such portions may, for example, solely include a non-opaque polymer. These non-luminescent portions provide for a transmission of the light, preferably the blue light that is emitted by the light emitter portion underneath. Those three sub-pixels may form a pixel of the display device. Depending on the exact display structure an area ratio between the three sub-pixels may differ from 1:1:1. The display device may have multiple pixels. By individually controlling the light emission of the three corresponding light emitter portions per pixel, a perceived color of light emitted by the subject pixel can be tuned. Therefore, the color conversion layer preferably comprises a multitude of first films, a multitude of second films, and a multitude of non-luminescent portions, a single one of each contributing to one pixel.

In one embodiment, each light emitter portion is represented by an organic light emitting diode (OLED). The OLED may be embodied as an integrated layered element, possibly including a top glass layer, onto which the assigned color conversion layer may be arranged, e.g. by ink jet printing. In such embodiment, the display device is an OLED display. Multiple pixels as defined above are comprised in the OLED display, each pixel comprising three OLEDs as light emitter portions, each OLED emitting blue light.

In a different embodiment, each light emitter portion is represented by an inorganic light emitting diode (LED). The LED may be embodied as an integrated layered element, possibly including a top glass layer, onto which the assigned color conversion layer may be arranged, e.g. by ink jet printing. In such embodiment, the display device is a LED display. Multiple pixels as defined above are comprised in the LED display, each pixel comprising three or more LEDs as light emitter portions, each LED emitting blue light.

In a different embodiment, the display device is a liquid crystal display (LCD), wherein the light emitter is a backlight of the liquid crystal display. Here, the color conversion layer may replace the color filter layer of a conventional display that solely filters incoming light, but does not emit light in response to an excitation. Accordingly, this display device additionally may comprise a first polarizer, a first substrate, a number of liquid crystals, a second substrate, and a second polarizer.

The display device may be used as a display of a mobile or stationary computing, telecommunication, or television device.

Luminescent crystals (LC) preferably are made from semiconductor materials. A luminescent crystal shall include a quantum dot, typically in the range of 3-12 nm and a nanocrystal of up to 100 nm and a luminescent crystal of up to 3 μm. Preferably, luminescent crystals are approximately isometric (such as spherical or cubic). Particles are considered approximately isometric, in case the aspect ratio (longest:shortest direction) of all 3 orthogonal dimensions is 1-2. LCs show, as the term indicates, luminescence or more specifically defined photoluminescence. In the context of the present invention a luminescent crystal typically is a single-crystalline particle spatially separated from other particles due to the presence of a surfactant. It is a semiconducting material which exhibits a direct bandgap (typically in the range 1.1-3.8 eV, more typically 1.4-3.5 eV, even more typically 1.7-3.2 eV). Upon excitation/illumination with electromagnetic radiation equal or higher than the bandgap, the valence band electron is excited to the conduction band leaving an electron hole in the valence band. The formed exciton (electron-electron hole pair) then radiatively recombines in the form of photoluminescence, with maximum intensity centered around the LC bandgap value and exhibiting photoluminescence quantum yield of at least 1%. In contact with external electron and electron hole sources LC could exhibit electroluminescence. In the context of the present invention LCs do not exhibit mechano-luminescence (e.g. piezoluminescence), chemiluminescence, electrochemiluminescence nor thermoluminescence.

A quantum dot (QD) particularly relates to a semiconductor nanocrystal, which has a diameter typically between 3-12 nm. In this range, the physical diameter of the QD is smaller than the bulk excitation Bohr radius, causing quantum confinement effect to predominate. As a result, the electronic states of the QD, and therefore the bandgap, are a function of the QD composition and physical size, i.e. the color of absorption/emission is linked with the QD size. The optical quality of the QDs sample is directly linked with their homogeneity (more monodisperse QDs will have smaller FWHM of the emission). When QD reach size bigger than the Bohr radius the quantum confinement effect is hindered and the sample may not be luminescent anymore as nonradiative pathways for exciton recombination may become dominant. Thus, QDs are a specific sub-group of nanocrystals, defined in particular by its size and size distribution. Properties of the QDs are directly linked with these parameters, distinguishing them from nanocrystals.

Each of the first and the second solid polymer compositions comprise in addition to the luminescent crystals of the respective type, a hardened, cured or dried polymer, preferably of the same type in both the first solid polymer composition and the second solid polymer composition, including an organic and/or an inorganic synthetic material. Preferably, the polymer is selected from the group of acrylate polymers (including copolymers), carbonate polymers, sulfone polymers, epoxy polymers, vinyl polymers, urethane polymers, ester polymers, cyclic olefin copolymers, styrene polymers and silicone polymers. Most preferably the polymer is selected from the list of acrylate polymers (including co-polymers), polystyrene, silicones and cyclic olefin copolymers. Furthermore the polymer can be linear or cross-linked.

In a preferred embodiment when the first film is in direct contact with the second film the polymer of the first film differs from the polymer of the second film in order to avoid potential intermixing of the first film with the second film.

The hardened/cured/dried polymer preferably is light transmissive, i.e. non-opaque for allowing light emitted by the luminescent crystals, and possible light of a light source used for exciting the luminescent crystals to pass.

Preferably, and in addition to the hardened/cured/dried polymer and the luminescent crystals of the respective type, one or more of the first and second polymer compositions comprises a surfactant selected from the group of non-ionic, anionic, cationic and zwitterionic surfactants; preferably selected from the group of amine or carboxy terminated surfactants.

The terms "surfactant", "ligand", "dispersant" and "dispersing agent" are known in the field and have essentially the same meaning. In the context of the present invention, these terms denote an organic substance, other than a solvent, which is used in suspensions or colloids to improve the separation of particles and to prevent agglomeration or settling. Without being bound to theory, it is believed that surfactants are physically or chemically attached on the particle surface either before or after adding the particles to the solvent and thereby provide the desired effects. The term surfactants includes polymer materials and small molecules; surfactants typically contain polar end-groups and apolar end-groups. In the context of the present invention, solvents (e.g. toluene) are not considered surfactants.

A "suspension" as used above in the aspect related to manufacturing is known and relates to a heterogeneous fluid of an internal phase (i.p.) that is a solid and an external phase (e.p.) that is a liquid. The external phase comprises one or more dispersants/surfactants, optionally one or more solvents and optionally one or more pre-polymers or dissolved polymers. Accordingly, each type of luminescent crystal (first, second) is added to the dedicated portion of suspension. Further processing includes the application of one or each portion of suspension to the desired area on the substrate. This step is also referred to as solution processing which denotes the application of a coating or thin film to a substrate by the use of a solution-based (=liquid) starting material. This is considered a significant advantage, as it enables manufacturing of all films by simple technologies applicable to large areas and continuous processing.

Preferably, the luminescent crystals of a conversion layer portion are embedded in a matrix such as a polymer matrix or an inorganic matrix, in order to spatially separate the first LCs from each other in the first film, and the second LCs from each other in the second film. The resulting "LC/QD composite" denotes a solid inorganic/organic composite material comprising LCs/QD, surfactant and a matrix and contributes to the respective first or second film.

Other advantageous embodiments are listed in the dependent claims as well as in the description below.

BRIEF DESCRIPTION OF THE DRAWINGS

Embodiments, examples, experiments representing or leading to embodiments, aspects and advantages of the invention will be better understood from the following detailed description thereof. Such description makes reference to the annexed drawings, wherein.

DETAILED DESCRIPTION OF THE DRAWINGS

Figure 1:
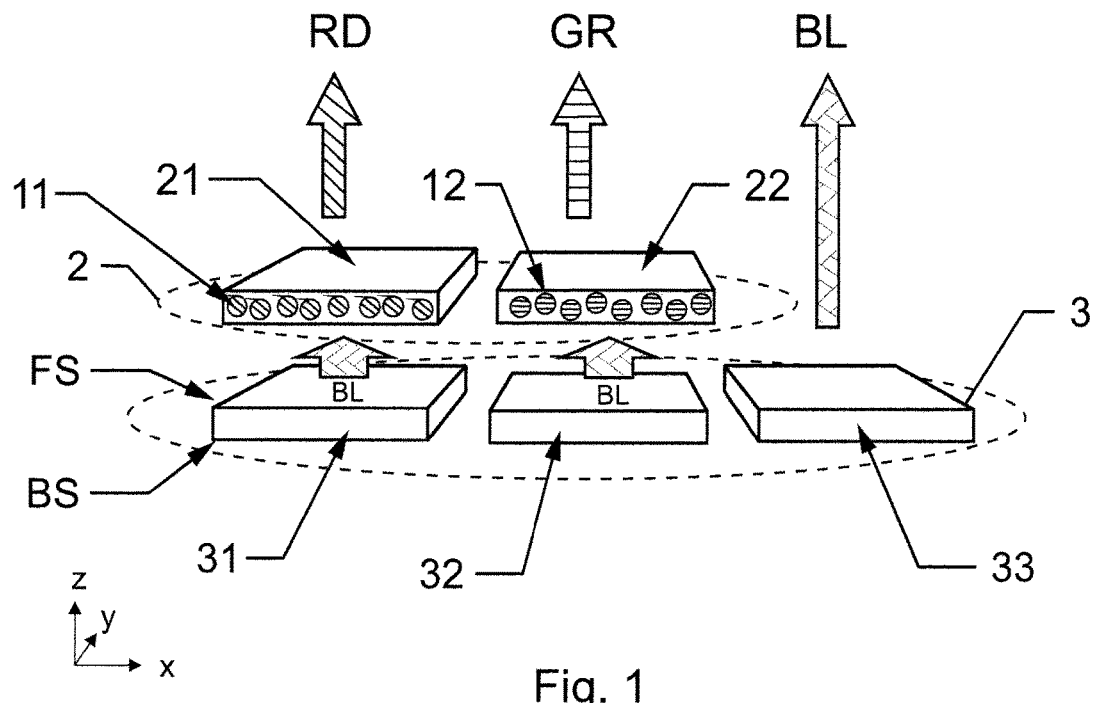
FIG. 1 shows an exploded view of a display device according to an embodiment of the present invention.

FIG. 1 illustrates an exploded view of a display device according to an embodiment of the present invention. The display device comprises a light emitter comprising a set 3 of three light emitter portions 31, 32, 33 with each having a front side FS and a back side BS. The display device comprises a color conversion layer 2. The conversion layer comprises a set 2 of a first and a second conversion layer portion 21, 22, wherein each conversion layer portion 21, 22, of the set corresponds to a light emitter portion 31, 32 of the set 3. Thereby, the set of conversion layer portions 2 can be arranged directly on a front side FS of the set of light emitter portions 3, wherein each conversion layer portion 21, 22 of the set 2 is in direct contact with the corresponding light emitter portion 31, 32 of the set 3, or there can be layers, e.g. for protecting the set 2 of conversion layers, interposed between the set of conversion layer portions 21, 22 and light emitter portions 31, 32. In addition, a conversion layer portion 21, and the corresponding light emitter portion 31 can be arranged adjacent to or spaced to a next pair of conversion layer portion 22 and corresponding light emitter portion 32.

Each of the first conversion layer portion 21, the second conversion layer portion 22, and the set 3 of light emitter portions have a length along the x-axis, a width along the y-axis, and a thickness along the z-axis.

The first conversion layer portion 21 comprises a first solid polymer composition in form of a first film. The first solid polymer composition at least comprises a first polymer and first luminescent crystals 11, wherein the first luminescent crystals 11 are selected from compounds of formula (I) as defined herein.

The first luminescent crystals 11 have a size between 3 nm and 3000 nm. In response to excitation by the corresponding first light emitter portion 31, the first luminescent crystals 11 emit red light RD.

The second conversion layer portion 2 comprises a second solid polymer composition in form of a second film. The second solid polymer composition comprises at least a second polymer and second luminescent crystals 12. The second luminescent crystals 12 are selected from compounds of formula (I) as defined herein.

The second luminescent crystals 12 have a size between 3 nm and 3000 nm. In response to excitation by the corresponding second light emitter portion 32, the second luminescent crystals 12 emit green light GR.

First and second polymer preferably but not necessarily are the same.

As is indicated in FIG. 1, once the first conversion layer 21 is exposed to radiation of the first light emitter portion 31, and in particular to blue radiation BL, the first luminescent crystals 11 are excited and emit red light RD. Once the second conversion layer 22 is exposed to radiation of the second light emitter portion 32, and in particular to blue radiation BL, the second luminescent crystals 12 are excited and emit green light GR. The third light emitter portion 33 is emitting blue light BL and does not correspond to one of the conversion layer portions of the set. The light emitter portion 31, 32, 33 of the set can be controlled independently, in particular the intensity of the individual light emitter portions 31, 32, 33 can be controlled individually.

The mixture of the emitted light in three colors gives the color hue that is emitted by the display device. Hence the present device can preferably be used as a building block of a display screen.

Figure 2:
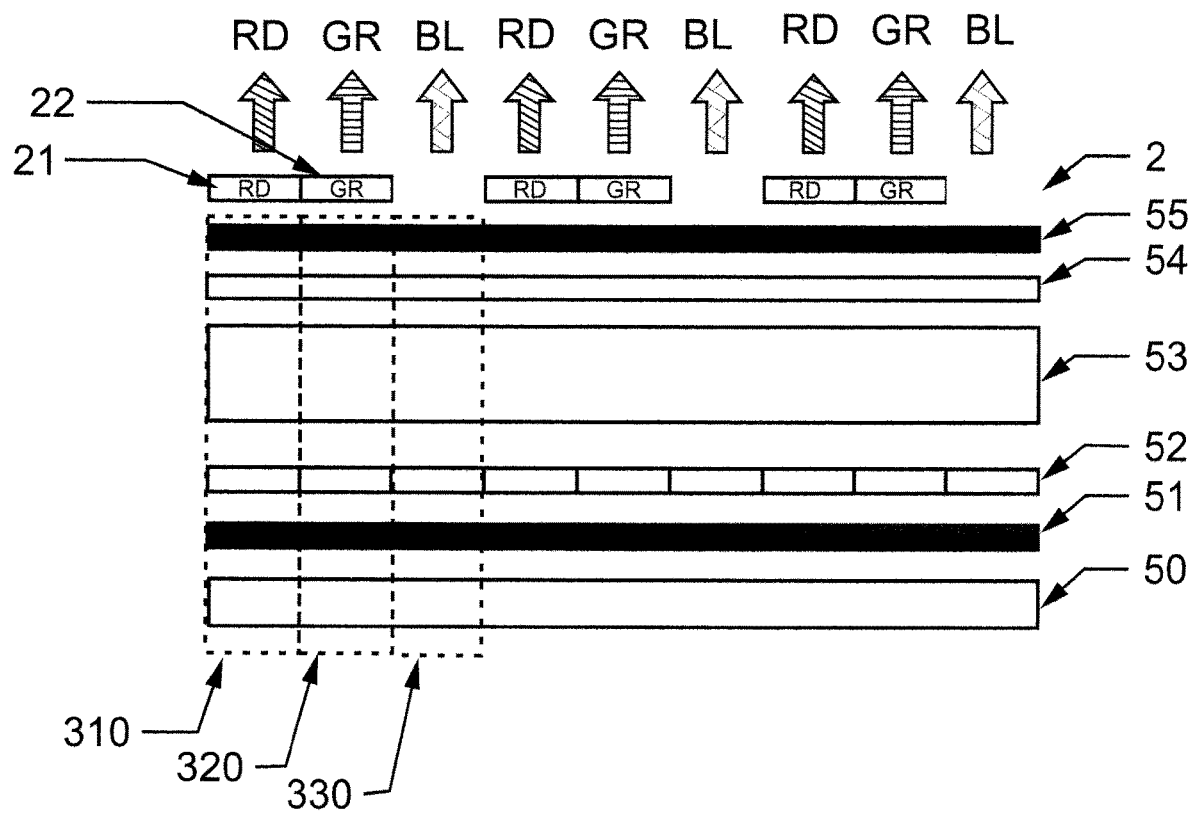
FIG. 2 shows an exploded view of a liquid crystal display according to a preferred embodiment of the invention.

FIG. 2 shows a preferred embodiment of the present invention, wherein the display device can be used as a building block for an LCD screen. The LCD screen essentially comprises a first 52 and a second 54 substrate, in particular glass substrates, wherein a layer of liquid crystals 53 is interposed between the first substrate 52 and the second substrate 54. The first substrate 52 comprises a wire layer for selectively applying an electric field to the liquid crystal layer 53. A first polarizer 51 is arranged on a side of the first substrate 52 which is directed away from the liquid crystal layer 53. The second substrate 54 comprises a common electrode directed towards the liquid crystal layer 53. A second polarizer 55 is disposed on a surface of the second substrate 54 directed away from the liquid crystal layer 53.

The polarization directions of the first 51 and the second 55 polarizers are rotated preferably by 90° to each other. Light emitted from a backlight 50 passes the first polarizer 51 and gets linearly polarized before entering the liquid crystal layer 53. Depending on the degree of twist of the liquid crystal molecules, which is dependent on the electric field applied via electrodes disposed on the first 52 and second substrate 54, the orientation of the polarization direction of the light entering the liquid crystal layer 53 is rotated, in particular the polarization direction is rotated by 90°. Only if the polarization direction of the light entering the liquid crystal layer 53 is polarized such that it can pass the second polarization filter 55, the light is emitted by the LCD screen.

In a first view, the first, second, and third light emitter portions 31, 32, 33 of the set 3 in FIG. 1 correspond to a first, second, and third portion 310, 320, 330 of a LCD display respectively, wherein a portion of the LCD display essentially comprises a portion of the backlight 50, a portion of the first polarizer 51, a portion of the first substrate 52, a group of liquid crystal molecules 53, a portion of the second substrate 54 and a portion of the second polarization filter 55. If the light exits the portion of the second polarization filter 55 and enters the first and second corresponding conversion layer 21, 22 of the set 2, it excites the respective luminescent crystals. In response to being excited by the corresponding first light emitter portion 310, the first luminescent crystals 11 emit red light RD. In response to being excited by the corresponding second light emitter portion 320, the second luminescent crystals 12 emit green light GR. Preferably, the third portion 330 of the LCD display is not assigned to a conversion layer portion of the set, such that the third portion 330 of the LCD display emits the preferably blue light BL of the backlight.

In a different view, the backlight 50 may be considered as light emitter on its own, while the selective emission of blue light to the individual conversion layer components is controlled by control elements which in the present case are the addressable liquid crystal molecules 53.

Figure 3:
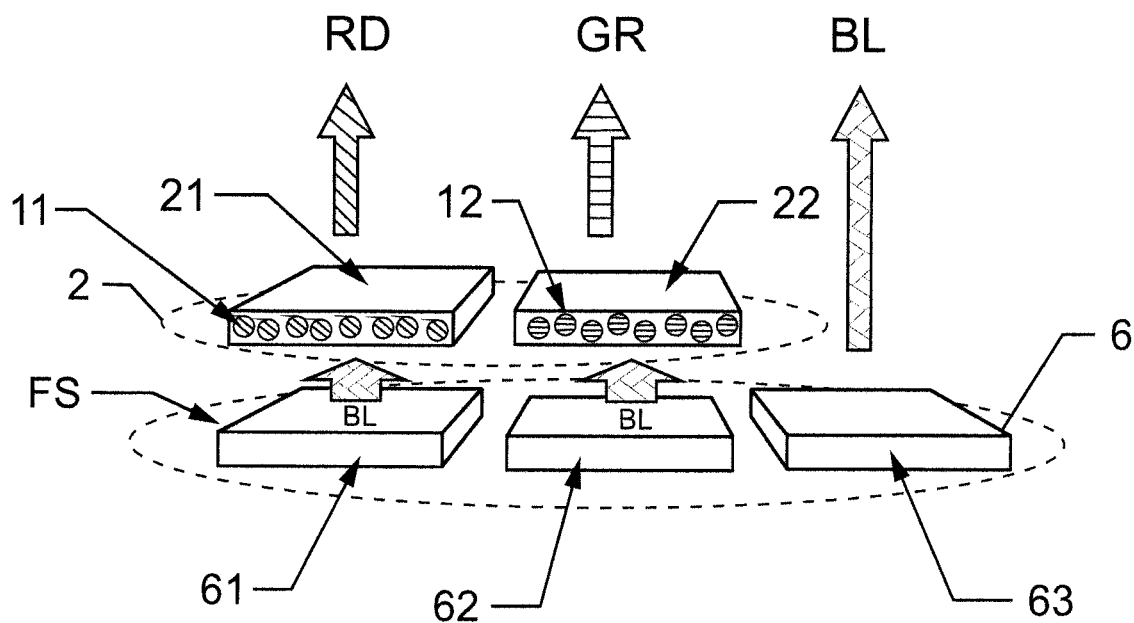
FIG. 3 shows an exploded view of a display device according to another embodiment of the present invention.

FIG. 3 shows an alternative embodiment of the display device wherein like numbers refer to like elements. The first, second, and third light emitter portion 31, 32, 33 of the set 3 in FIG. 1 correspond to a first, second, and third organic light emitting diode (OLED) 61, 62, 63 preferably emitting blue light. The conversion layer portions 21, 22 of the set 2 can be directly arranged onto a front side FS of the respectively first 61 and second 62 OLED or can be arranged onto a packaging of the respective OLED. The third OLED 63 does not correspond to any of the conversion layer portions 21, 22, of the set 2.

While presently preferred embodiments of the invention are shown and described, it is to be distinctly understood that the invention is not limited thereto but may be otherwise variously embodied and practiced within the scope of the following claims.

EXAMPLES

Example 1

Luminescent crystals with green emission (LCs) were synthesized according to literature procedure presented by Protesescu et al. (Nano Lett., 2015, 15, 3692-3696). The LCs concentration was defined as 0.54% by heating up the dispersion to 450° C., which led to evaporation of the solvent and burning away the ligands. The dispersion was optically characterized with a Quantaurus C11347-11 Total Quantum Yield device (equipped with an integration sphere). The LCs dispersion, excited at 450 nm had a photoluminescence peak centered at 500 nm with a FWHM of 23 nm and a photoluminescence quantum yield of 89%.

11.75 wt % of this formulation was mixed with 87.25 wt % of 30 wt % PMMA (Plexiglas 7N) solution in toluene and 1 wt % $TiO_2$ scatter particles (Kronos 2800) and directly poured onto a glass substrate preheated to 60° C. The excess of the mixture was removed with a doctor blade, and after 4 h 60° C. drying resulting in an approximately 400 µm thick film. Upon excitation with 450 nm light the film exhibited photoluminescence with a peak centered at 500 nm with a FWHM of 22 nm and a photoluminescence quantum yield of 76%. Based on the measured solids load of the starting formulation the film had a Pb concentration of 775 ppm.

Figure 4:
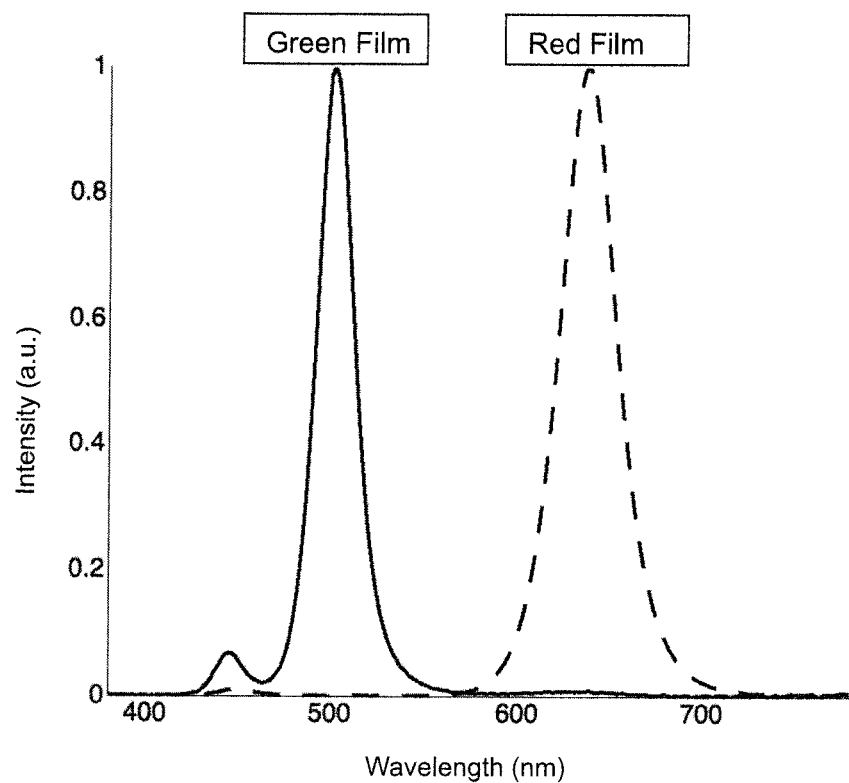
FIG. 4 shows the light spectrum passing through a color conversion layer embodied as a polymeric foil containing green or red emitting LCs according to an embodiment of the present invention, when excited with the 450 nm blue backlight of a Samsung SUHD TV (Model UE48JS8580T).

Placing this foil on the blue Samsung SUHD TV backlight (Model UE48JS8580T) resulted in emission of only green light with a peak centered at 500 nm (FIG. 4).

Example 2

Red emitting LCs were synthesized according to literature procedure presented by Protesescu et al. (Nano Lett., 2015, 15, 3692-3696). The LCs concentration was defined as 0.06% by heating up the dispersion to 450° C., which led to evaporation of the solvent and burning away the ligands. The dispersion was optically characterized with a Quantaurus C11347-11 Total Quantum Yield device (equipped with an integration sphere). The LCs dispersion, excited at 450 nm) had a photoluminescence peak centered at 638 nm with a FWHM of 33 nm and a photoluminescence quantum yield of 72%.

16.875 wt % of this formulation was mixed with 80.125 wt % of 30 wt % PMMA (Plexiglas 7N) solution in toluene and 3 wt % $TiO_2$ scatter particles (Kronos 2800) and directly poured onto a glass substrate preheated to 60° C. The excess of the mixture was removed with a doctor blade, and after 4 h 60° C. drying resulting in an approximately 400 µm thick film. Upon excitation with 450 nm light the film exhibited photoluminescence with a peak centered at 641 nm with a FWHM of 31 nm and a photoluminescence quantum yield of 70%. Based on the measured solids load of the starting formulation the film had a Pb concentration of 90 ppm.

Placing this foil on the blue Samsung SUHD TV backlight (Model UE48JS8580T) resulted in emission of red light only (blue light completely absorbed) with a peak centered at 641 nm (FIG. 4).

The invention claimed is:

1. A display device comprising:
a light emitter comprising a set of light emitter portions, wherein at least one light emitter portion of the set is configured to emit light with an excitation wavelength,
a color conversion layer comprising a set of conversion layer portions,
wherein at least one conversion layer portion of the set comprises a film comprising a solid polymer composition, wherein the solid polymer composition comprises luminescent crystals
wherein the luminescent crystals
are of perovskite structure
are selected from compounds of formula (I):
$M^1{}_aM^2{}_bX_c$ (I), wherein
$M^1$ represents Cs, optionally doped with up to 30 mol % of one or more other metals having coordination number 12,
$M^2$ represents Pb, optionally doped with up to 30 mol % of one or more metals having coordination number 6,
X independently represents anions selected from the group consisting of Cl, Br, I, cyanide, and thiocyanate,
a represents 1,
b represents 1,
c represents 3;
are of size between 3 nm and 3000 nm,
emit light of a wavelength in response to excitation by the light emitted by at least one corresponding light emitter portion of the set, wherein the excitation wavelength is shorter than the wavelength; and
wherein the film has a thickness between 5 µm and 500 µm; and
wherein the concentration of crystals in said film is between 0.01 wt % and 0.5 wt %.

2. The display device according to claim 1,
wherein the luminescent crystals are of size between 5 nm and 100 nm; and/or
wherein the amount of the luminescent crystals is below 2.0 g/m².

3. The display device according to claim 1,
wherein the luminescent crystals per conversion layer portion are selected from the group consisting of
$CsPbBr_xI_{3-x}$, whereby 0≤x<2,
$CsPbCl_yBr_{3-y-z}I_z$, where 0<y<1, 2≤z≤3-y,
each for emitting red light, or
$CsPbBr_xI_{3-x}$, where 2≤x≤3
$CsPbCl_yBr_zI_{3-y-z}$, where 0<y<1, 1<z≤3-y,
each for emitting green light.

4. The display device according to claim 1,
wherein the solid polymer composition comprises a polymer selected from the group of acrylate polymers, carbonate polymers, sulfone polymers, epoxy polymers, vinyl polymers, urethane polymers, ester polymers, styrene polymers, silicone polymers and cyclic olefin copolymers.

5. The display device according to claim 1,
wherein a thickness of the film is between 10 µm and 500 µm for emitting red light and 30 µm and 500 µm for emitting green light.

6. The display device according to claim 1, wherein the color conversion layer has an optical haze between 10% and 99%.

7. The display device according to claim 1,
wherein a first conversion layer portion of the set comprises a first film comprising first luminescent crystals that emit red light in response to excitation by light emitted by a first corresponding light emitter portion of the set, and
wherein a second conversion layer portion comprises a second film comprising second luminescent crystals that emit green light in response to excitation by light emitted by a second corresponding light emitter portion of the set.

8. The display device according to claim 1, wherein a number of light emitter portions of the set is higher than a number of conversion layer portions of the set.

9. The display device according to claim 7, comprising a pixel, the pixel comprising:
the first conversion layer portion with the corresponding first light emitter portion,
the second conversion layer portion with the corresponding second light emitter portion, and
a third light emitter portion.

10. The display device according to claim 1, comprising
a barrier layer encompassing the color conversion layer as a whole or the conversion layer portions individually having a water vapor transmission rate of less than 0.2 g mm m⁻² day⁻¹,
wherein a material of each barrier layer is selected from the group consisting of polyvinylidene chlorides, cyclic olefin copolymers, high-density polyethylene, metal oxides, $SiO_x$, $Si_xN_y$; optionally in the form of organic/inorganic multilayers.

11. The display device according to claim 1, wherein the color conversion layer comprises scattering particles, in particular made of $TiO_2$ or $ZrO_2$,
wherein the scattering particles have a refractive index (RI) of RI>2,
wherein the scattering particles have a size of 100 nm to 1000 nm, and/or
wherein a concentration of scattering particles in the color conversion layer is between 1 and 40 wt %.

12. The display device according to claim 1,
wherein each of the light emitter portions comprises an organic light emitting diode (OLED), and
in particular wherein the display device is an OLED display.

13. The display device according to claim 1,
wherein each of the light emitter portions comprises an inorganic light emitting diode (LED).

14. The display device according to claim 1,
wherein the light emitter is a backlight of a liquid crystal display (LCD), and
in particular wherein the display device is a LCD display.

15. The display device according to claim 14, comprising a first polarizer, a first substrate, a number of liquid crystals, and a second substrate.

16. The display device according to claim 8, comprising a pixel, the pixel comprising:
the first conversion layer portion with the corresponding first light emitter portion,
the second conversion layer portion with the corresponding second light emitter portion, and
a third light emitter portion.

17. The display devise according to claim 1, wherein the amount of the luminescent crystals is below 1.5 g/m².

18. The display device according to claim 4 wherein the solid polymer composition comprises a polymer selected from the group of polyacrylates and polyacrylate copolymers, polystyrene, silicones and cyclic olefin copolymers.

19. The display device according to claim 1, wherein the color conversion layer comprises scattering particles, in particular made of $TiO_2$ or $ZrO_2$,
- wherein the scattering particles have a refractive index (RI) of RI>2,
- wherein the scattering particles have a size of 100 nm to 1000 nm, and/or
- wherein a concentration of scattering particles in the color conversion layer is between 3 and 20 wt %.

20. The display device according to claim 15, further comprising a second polarizer.

* * * * *